(12) United States Patent
Dawson et al.

(10) Patent No.: US 7,068,554 B1
(45) Date of Patent: Jun. 27, 2006

(54) APPARATUS AND METHOD FOR IMPLEMENTING MULTIPLE MEMORY REDUNDANCY WITH DELAY TRACKING CLOCK

(75) Inventors: James W. Dawson, Poughkeepsie, NY (US); Thomas J. Knips, Wappingers Falls, NY (US); Donald W. Plass, Poughkeepsie, NY (US); Kenneth J. Reyer, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/054,272

(22) Filed: Feb. 9, 2005

(51) Int. Cl.
*G11C 7/00* (2006.01)

(52) U.S. Cl. .................. 365/200; 365/189.07; 365/233

(58) Field of Classification Search ...................... None
See application file for complete search history.

(56) References Cited

U.S. PATENT DOCUMENTS

| | | | | |
|---|---|---|---|---|
| 5,798,974 A | * | 8/1998 | Yamagata | 365/200 |
| 5,862,087 A | * | 1/1999 | Lee | 365/200 |
| 6,191,982 B1 | * | 2/2001 | Morgan | 365/200 |
| 6,668,345 B1 | * | 12/2003 | Ooishi et al. | 714/710 |
| 6,757,852 B1 | * | 6/2004 | Ghassemi et al. | 714/711 |
| 2005/0002243 A1 | | 1/2005 | Mohr et al. | 365/200 |

* cited by examiner

*Primary Examiner*—Son Mai
(74) *Attorney, Agent, or Firm*—Lynn Augspurger; Cantor Colburn LLP

(57) ABSTRACT

A memory redundancy control apparatus includes a static compare stage configured to compare bits of a requested memory address to corresponding fuse information bits representing a defective memory address. A dynamic stage is configured to receive outputs of the static compare stage, with an output of the dynamic stage being precharged so as to initially deactivate primary subarray decoding circuitry. The dynamic stage is further triggered by a clock signal thereto. Upon activation of the clock signal, the output of the dynamic stage remains precharged whenever a match exists between the requested memory address and the defective memory address, and the output of the dynamic stage is discharged whenever a mismatch exists between the requested memory address and the defective memory address. A delay tracking clock generator is configured to generate a delay tracking clock signal with respect to the dynamic stage, to gate the output of the dynamic stage to spare subarray decoding circuitry, wherein the spare subarray decoding circuitry is activated whenever the output of the dynamic stage remains precharged following activation of the clock signal.

17 Claims, 4 Drawing Sheets

APPARATUS AND METHOD FOR IMPLEMENTING MULTIPLE MEMORY REDUNDANCY WITH DELAY TRACKING CLOCK

BACKGROUND

The present invention relates generally to integrated circuit devices, and, more particularly, to an apparatus and method for implementing multiple memory redundancy using a delay-tracking clock.

Static Random Access Memories (SRAMs) are memory elements that store data in the form of complementary low voltage and high voltage at opposite sides of the memory cell. An SRAM retains the memory value therein so long as power is applied to the circuit, unlike dynamic random access memory (DRAM) that must be periodically refreshed in order for the data to be maintained therein. Conventionally, if the "true" node of an SRAM is read as a high voltage, then the value of the SRAM cell is logical one. Conversely, if the true node is read as a low voltage, the value of the SRAM cell is logical zero.

Due to the high degree of miniaturization possible today in semiconductor technology, the size and complexity of designs that may be implemented in hardware has increased dramatically. This has made it technologically feasible and economically viable to develop high-speed, application specific architectures featuring a performance increase over previous architectures. Process scaling has been used in the miniaturization process to reduce the area needed for both logic functions and memory (such as SRAM) in an effort to lower the product costs.

In order to improve the yield of high-speed, high-density SRAM products, redundant elements are incorporated into the devices. These redundant elements may include for example, row elements, column elements, or both. Generally speaking, the larger the SRAM device, the more repair actions are likely needed for yield improvement. With the availability of multiple row and column repair actions, yield is significantly improved since there is greater flexibility in dealing with the various defect mechanisms. However, one problem associated with more complicated, multiple repair actions is the increase in time taken to perform the repair actions. With conventional static redundancy decoding schemes, multiple repair actions can conceivably place limit on the access time of the memory device and, as such, adversely affect system performance.

Accordingly, it would be desirable to be able to implement a multiple word redundancy repair scheme in a manner that minimizes the impact on device performance.

SUMMARY

The foregoing discussed drawbacks and deficiencies of the prior art are overcome or alleviated by a memory redundancy control apparatus. In an exemplary embodiment, the apparatus includes a static compare stage configured to compare bits of a requested memory address to corresponding fuse information bits representing a defective memory address. A dynamic stage is configured to receive outputs of the static compare stage, with an output of the dynamic stage being precharged so as to initially deactivate primary subarray decoding circuitry. The dynamic stage is further triggered by a clock signal thereto. Upon activation of the clock signal, the output of the dynamic stage remains precharged whenever a match exists between the requested memory address and the defective memory address, and the output of the dynamic stage is discharged whenever a mismatch exists between the requested memory address and the defective memory address. A delay tracking clock generator is configured to generate a delay tracking clock signal with respect to the dynamic stage, the delay tracking clock signal configured to gate the output of the dynamic stage to spare subarray decoding circuitry, wherein the spare subarray decoding circuitry is activated whenever the output of said dynamic stage remains precharged following activation of said clock signal.

In another embodiment, a memory redundancy control apparatus, includes a plurality of compare stages, each compare stage configured to compare bits of a requested memory address to fuse information bits corresponding to one of a plurality of defective memory address. Each compare stage further includes a static exclusive OR (XOR) block for each bit in the memory address, the static XOR blocks configured to compare an individual bit of the requested memory address with an individual fuse information bit, with outputs of the static XOR blocks inputted to a dynamic NOR stage for each of the defective memory addresses. Each dynamic NOR stage has a precharged output so as to initially deactivate primary subarray decoding circuitry. The dynamic NOR stages are further triggered by a clock signal thereto. Upon activation of the clock signal, the output of a given dynamic NOR stage remains precharged whenever a match exists between the requested memory address and the defective memory address corresponding to the given dynamic NOR stage, and the output of the given dynamic NOR stage is discharged whenever a mismatch exists between the requested memory address and the defective memory address.

BRIEF DESCRIPTION OF THE DRAWINGS

Referring to the exemplary drawings wherein like elements are numbered alike in the several Figures.

DETAILED DESCRIPTION

Disclosed herein is an apparatus and method for implementing dynamic multiple SRAM word redundancy using a delay-tracking clock. Briefly stated, a dynamically precharged compare function is used to compare address bits with fuse bits of defective addresses in order to quickly evaluate whether a match or a mismatch exists. If no matches exist (i.e., no repair operations are made), then the primary subarray decoding circuitry is enabled. On the other hand, if at least one match exists, the primary subarray decoding circuitry stays deactivated in accordance with the precharged condition, and a redundant (spare) subarray is enabled. The low order wordline address bits (not part of the compare) may be used to decode which particular wordline is selected in the redundant subarray.

The redundancy scheme described herein is advantageous in that wordlines may be repaired in clusters or individually, without restrictions on using all of the repair actions in one subarray. Additional repair actions may also be implemented by widening the logic tree. In addition, a delay-tracking circuit is implemented to time the selection of a spare element once the address compare operation is completed.

Figure 1:
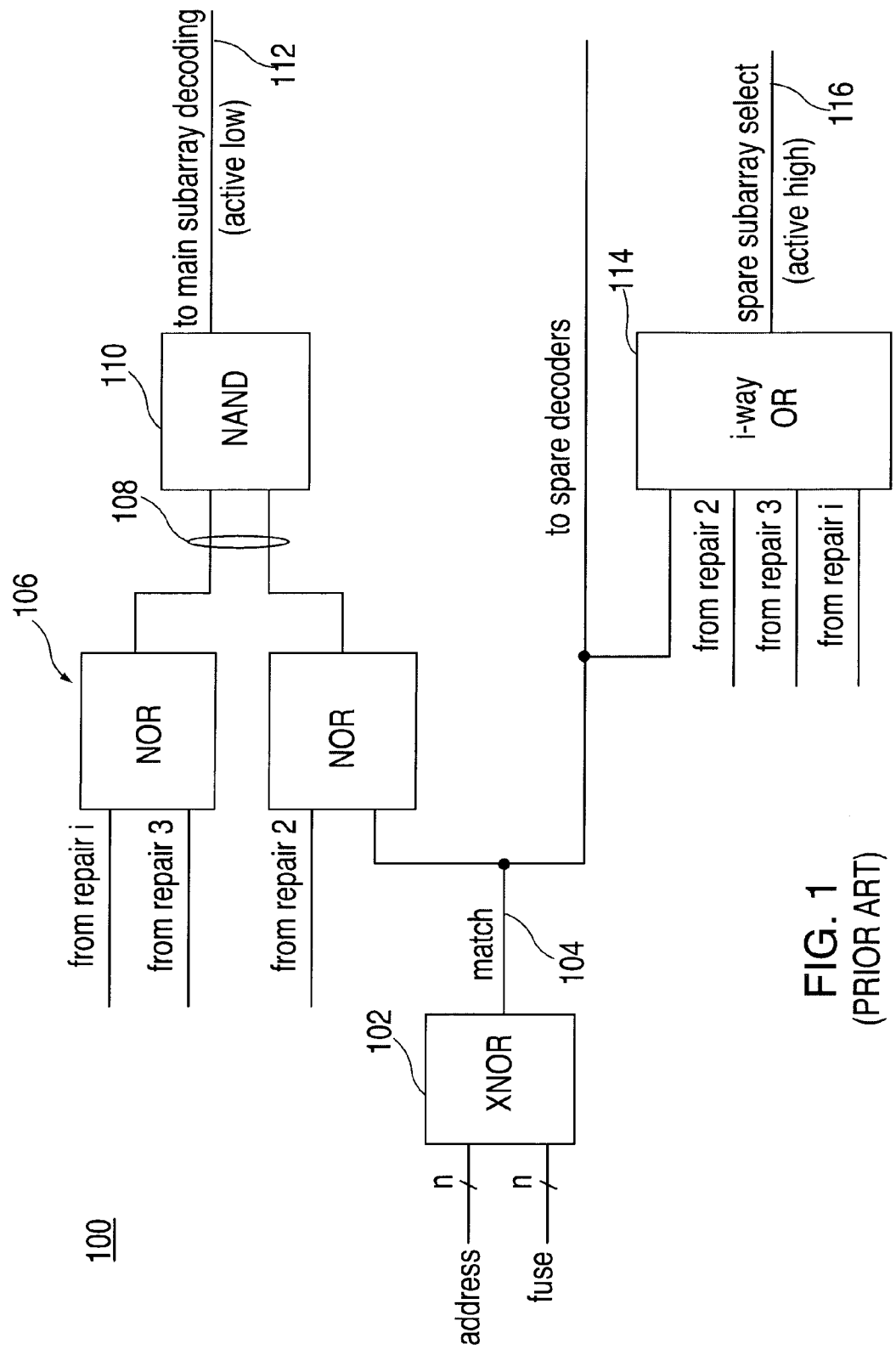
FIG. 1 is a block diagram of a conventional static word redundancy scheme for an SRAM device.

Referring initially to FIG. 1, there is shown a block diagram of a conventional static word redundancy scheme for an SRAM device. A compare tree 102 compares a requested n-bit address with an n-bit programmed fuse address to see whether the address is a defective one. If each of the address bits matches the corresponding fuse bit, then the XNOR logic implemented by the compare tree 102 generates a logic high signal at the match node 104. This will in turn indicate at least one word repair action to be implemented by the redundancy scheme 100. Additional compare operations and repair actions may also be carried out, using a similar logic tree, to generate compare output signals.

As further shown in FIG. 1, each compare output signal from an XNOR tree is input to a NOR stage 106 of the main subarray decoding logic. Accordingly, if any of the compare signals inputted thereto is high (i.e., there is at least one address/fuse match), at least one of the NOR stage outputs 108 will be low. Again, this indicates that at least one word repair action is to take place. Furthermore, the NOR stage outputs 108 are themselves input to a NAND stage 110, the output of which represents an active low control signal 112 to the main subarray decoding circuitry. Thus, if any of the NOR stage outputs 108 are in fact low, then main subarray control signal 112 will be high so as to deactivate the main subarray decoding circuitry.

Conversely, the spare subarray decoding logic receives the same set of compare output signals through an OR stage 114. If any of the compare output signals are high, then the spare subarray control signal 116 will be activated high so as to enable the spare subarray select circuitry. However, as stated above, with an increased number of repair actions desired to be implemented (such as would be the case for large SRAMs containing many memory cell subarrays), a practical limit on the access time of the memory device is created due to the static nature of the compare and main/spare subarray decoding circuitry, which in turn adversely affects system performance.

Figure 2:
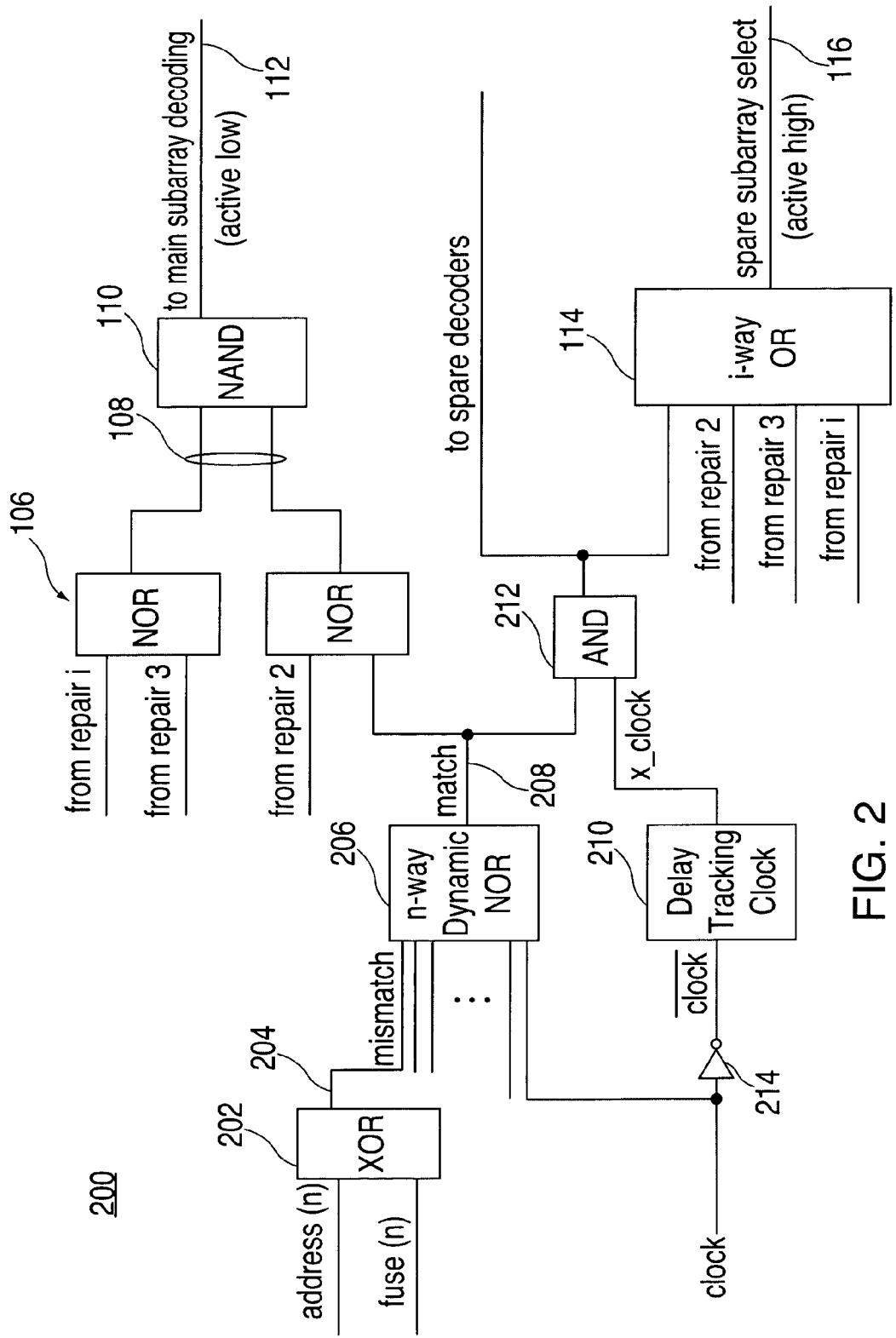
FIG. 2 is a block diagram of a dynamic word redundancy scheme for an SRAM device, using a delay-tracking clock, in accordance with an embodiment with an invention.

Therefore, in accordance with an embodiment of the invention, FIG. 2 is a block diagram of a dynamic word redundancy scheme 200 for an SRAM device, using a delay-tracking clock to facilitate efficient gating of the spare subarray portion of the redundancy circuit. For ease of description, similar elements in the dynamic word redundancy scheme 200 of FIG. 2 are designated with the same reference numerals indicated in FIG. 1. In particular, the first stage of redundancy scheme 200 also includes a static compare function for comparing a current address with a programmed fuse address corresponding to a repair operation. However, in the present embodiment, the address/fuse compare functions are implemented through XOR logic such that a mismatch between an individual address bit and the corresponding fuse bit results in a high output, and an individual bit match results in a low output.

An individual XOR block 202 is illustrated in FIG. 2, and shows a comparison between a single bit of the requested address with the corresponding fuse bit. Thus, for an n-bit address, the compare function will include n XOR blocks 202. The output node 204 ("mismatch") of each XOR compare block 202 is input into an n-way, dynamic NOR compare stage 206. The NOR stage 206 is dynamic in that the output node 208 thereof ("match") is precharged to a logic high level, which initially presumes that a repair operation will take place. Because node 208 is initially high, it will be recognized that the main subarray decoding signal 112 is also precharged high. Since signal 112 is an active low signal, the main subarray decoding circuitry will be deactivated during the precharge period.

Figure 3:
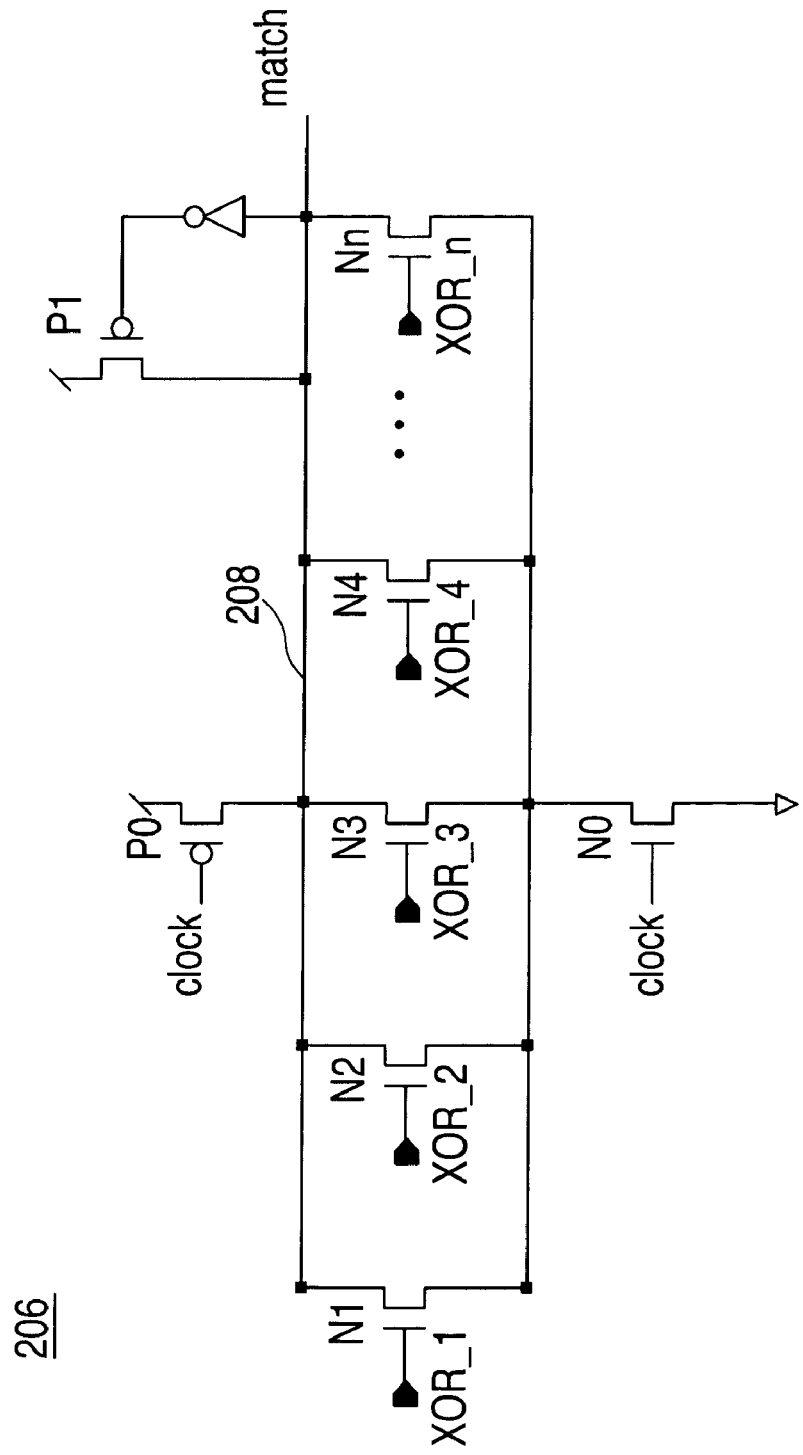
FIG. 3 is a schematic diagram of one possible implementation of an n-way dynamic NOR stage illustrated in FIG. 2.

One possible implementation of the dynamic NOR stage 206 is illustrated in FIG. 3. As is shown, the dynamic NOR stage 206 includes a parallel combination of n NFET devices (N1 through Nn), the gate terminals thereof (XOR_1 through XOR_n) are coupled to corresponding output nodes 204 of the XOR compare blocks 202 in FIG. 2. The dynamic NOR stage 206 further includes a clocked PFET device P0 for precharging the match node 208 high prior to the evaluation period (during which "clock" is low). In order to prevent DC power dissipation within the dynamic NOR stage 206 during the static period, a footer NFET N0 is also driven by the clock signal. In addition, a half-latch PFET P1 holds the match node 208 high if no NFETs (N1 through Nn) are conducting.

So long as there is at least a one bit mismatch between the address and the fuse information, there will be at least one dynamic NOR NFET that acts to pull down the match node 208. However, if any of the i match nodes 208 remain precharged (i.e., indicating a match with one of the defective fuse addresses), then at least one of the NOR stage outputs 108 in FIG. 2 will remain low, meaning that the output of NAND stage 110 will remain high to keep the main subarray decoding circuitry deactivated. Thus, in order for the main subarray decoding circuitry to be activated (i.e., output signal 112 is pulled down to active low), each of the match nodes 208 must be pulled low. Again, for a given match node 208 to be pulled low, there must be a mismatch condition (i.e., at least a one bit mismatch) between the requested address and the fuse data corresponding to the particular dynamic NOR stage.

Referring again to FIG. 2, if a match is detected on any of the match nodes 208 (in addition to maintaining main subarray decoding output signal 112 at its precharged high, deactivated level), the spare subarray control signal 116 is triggered by a delay tracking clock generator 210 that generates a delayed clock signal (x_clock) that passes the high match node signal through an AND gate 212. Because the input to the delay tracking clock generator 210 utilizes a negative going clock input, and the dynamic NOR stage 206 uses a positive clock input, an inverter 214 is used to generate clock_bar.

The elements included within the delay tracking clock generator 210 are configured so as to provide a delay sufficient to allow for the possibility of a weak pulldown of a match node 208 (i.e., a one-bit mismatch in which only a single NFET works to pull down the match node 208). In other words, if a falling signal on the match node 208 is gated too quickly through AND gate 212, a false logic high input to the OR stage 114 could erroneously cause the spare subarray circuitry to be activated. On the other hand, if the delay generated by the delay tracking clock generator 210 is too great, then the performance of the device is negatively impacted and would not provide any significant advantage over a static redundancy scheme. As such, this delay is designed to gate the activation of a spare subarray select circuit as soon as it is determined that a precharged match node will remain high.

Figure 4:
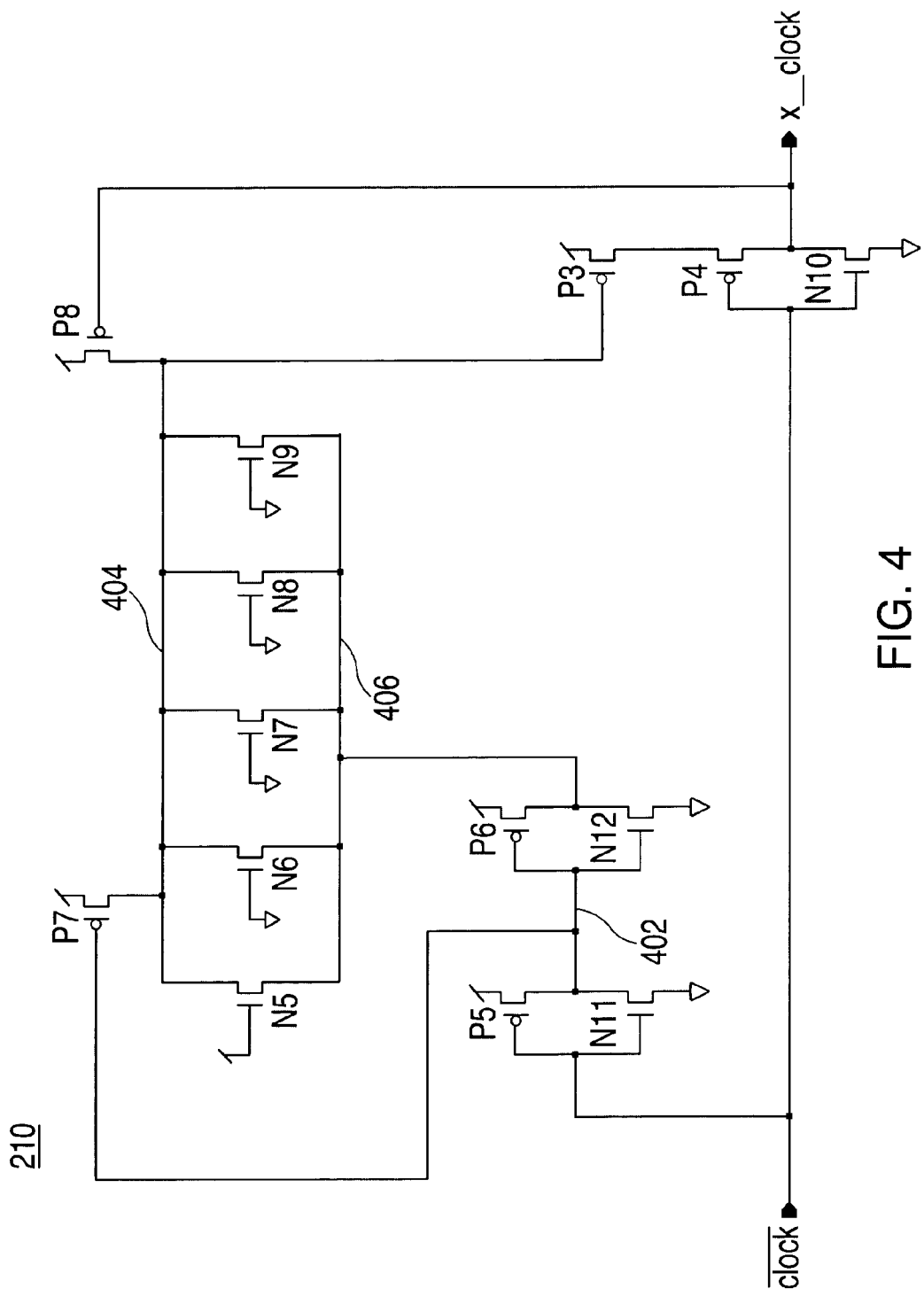
FIG. 4 is a schematic diagram of one possible implementation of the delay-tracking clock generator illustrated in FIG. 2.

FIG. 4 is a schematic diagram of one possible implementation of the delay-tracking clock generator 210 illustrated in FIG. 2. As the inverted signal clock_bar is active low, NFET N10 is conductive (with P4 non-conductive) so as to hold signal x_clock low during the precharge/static period. Simultaneously, clock_bar is input into a first inverter stage (P5, N11), the output node 402 of which is coupled to PFET P7. During the static period, P7 pulls node 404 up high. Node 406, which is an output of a second inverter stage (P6, N12), is also maintained at a logic high potential during the static period. In addition, P8 is configured as a half-latch controlled by the value of x_clock in order to mimic the half-latch P1 used in the dynamic NOR stage 206.

During the evaluation period, input signal clock_bar goes active low, causing N10 to turn off and decouple x_clock from ground potential. As a result of node 402 transitioning from low to high, P7 is switched off, thereby decoupling node 404 from a logic high potential. Furthermore, the output node 406 of the second inverter stage is now low, thereby providing a ground path for the charge on node 404, through NFET N5 (the gate terminal thereof coupled to a logic high potential). The additional parallel NFETs between nodes 404 and 406, (N6 through N9) the gate terminals thereof being grounded, effectively serve as a load capacitance that affects the rate at which node 404 is discharged to ground. Once node 404 is finally discharged, x_clock will at that point be pulled high through conductive PFETs P3 and P4.

Finally, it should be appreciated that the configuration of devices shown in FIG. 4 is presented by way of example only, and that a different number of devices (such as capacitive NFETs, for example) could be used. Moreover, it is further contemplated that other circuit embodiments could be used to implement the delay tracking clock generator 210 of FIG. 2, provided the delay is tied to the performance of the dynamic NOR stage 206.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A memory redundancy control apparatus, comprising:
   a static compare stage configured to compare bits of a requested memory address to corresponding fuse information bits representing a defective memory address;
   a dynamic stage configured to receive outputs of said static compare stage, with an output of said dynamic stage being precharged so as to initially deactivate primary subarray decoding circuitry, said dynamic stage further triggered by a clock signal thereto;
   upon activation of said clock signal, said output of said dynamic stage remains precharged whenever a match exists between said requested memory address and said defective memory address, and said output of said dynamic stage is discharged whenever a mismatch exists between said requested memory address and said defective memory address; and
   a delay tracking clock generator configured to generate a delay tracking clock signal with respect to said dynamic stage, said delay tracking clock signal configured to gate said output of said dynamic stage to spare subarray decoding circuitry, wherein said spare subarray decoding circuitry is activated whenever said output of said dynamic stage remains precharged following activation of said clock signal.

2. The apparatus of claim 1, further comprising:
   a plurality of dynamic NOR stages corresponding to each of a plurality of compare operations between a requested memory address and fuse information bits representing a plurality of defective memory addresses;
   a static NOR stage configured to receive a plurality of outputs corresponding to said plurality of dynamic NOR stages; and
   a static NAND stage configured to receive outputs from said static NOR stage;
   wherein an output of said static NAND stage is used to determine whether said primary subarray decoding circuitry is activated or remains deactivated.

3. The apparatus of claim 2, wherein said static compare stage comprises a plurality of exclusive OR (XOR) elements.

4. The apparatus of claim 3, wherein each of said plurality of dynamic NOR stages further comprises a plurality of n parallel NFET devices, wherein n corresponds to the number of address bits in said requested memory address.

5. The apparatus of claim 4, wherein each of said plurality of dynamic NOR stages further comprises a pull up PFET device configured to precharge the corresponding output node thereof prior to activation of said clock signal.

6. The apparatus of claim 2, further comprising an OR stage configured to receive gated outputs from each of said dynamic NOR stages, wherein an output of said OR stage is used to determine whether said spare subarray decoding circuitry is activated.

7. The apparatus of claim 1, wherein said delay tracking clock generator further comprises:
   an input corresponding to an inverted value of said clock signal;
   an output precharged to a logic low level;
   a plurality of NFET devices configured to provide a capacitive load on an internal node precharged to a logic high level, wherein a discharge of said internal node following an active low input to said delay tracking clock generator causes said precharged low output to be pulled up to logic high so as to generate said delay tracking clock signal.

8. The apparatus of claim 7, wherein said capacitive load of said delay tracking clock generator is configured so as to enable the generation of said delay tracking clock signal to correspond to a discharge of said precharged output of said dynamic stage following a one-bit mismatch condition.

9. A memory redundancy control apparatus, comprising:
   a plurality of compare stages, each compare stage configured to compare bits of a requested memory address to fuse information bits corresponding to one of a plurality of defective memory address;
   each compare stage further comprising a static exclusive OR (XOR) block for each bit in said memory address, said static XOR blocks configured to compare an individual bit of said requested memory address with an individual fuse information bit, with outputs of said static XOR blocks inputted to a dynamic NOR stage for each of said defective memory addresses;
   each dynamic NOR stage having a precharged output so as to initially deactivate primary subarray decoding circuitry, said dynamic NOR stages further triggered by a clock signal thereto;
   upon activation of said clock signal, the output of a given dynamic NOR stage remains precharged whenever a match exists between said requested memory address and the defective memory address corresponding to the given dynamic NOR stage, and the output of the given dynamic NOR stage is discharged whenever a mismatch exists between said requested memory address and said defective memory address; and a delay tracking clock generator configured to generate a delay tracking clock signal with respect to said dynamic NOR stages, said delay tracking clock signal configured to gate the outputs of said dynamic NOR stages to spare subarray decoding circuitry, wherein said spare subarray decoding circuitry is activated whenever any of the outputs of said dynamic stages remains precharged following activation of said clock signal.

10. The apparatus of claim 9, further comprising:

a static NOR stage configured to receive the outputs corresponding to said plurality of dynamic NOR stages; and a static NAND stage configured to receive outputs from said static NOR stage;

wherein an output of said static NAND stage is used to determine whether said primary subarray decoding circuitry is activated or remains deactivated.

11. The apparatus of claim 9, wherein said primary subarray decoding circuitry is activated whenever each of the outputs of said dynamic NOR stages are discharged.

12. The apparatus of claim 11, wherein each of said plurality of dynamic NOR stages further comprises a plurality of n parallel NFET devices, wherein n corresponds to the number of address bits in said requested memory address.

13. The apparatus of claim 12, wherein each of said plurality of dynamic NOR stages further comprises a pull up PFET device configured to precharge the corresponding output node thereof prior to activation of said clock signal.

14. The apparatus of claim 10, further comprising an OR stage configured to receive gated outputs from each of said dynamic NOR stages, wherein an output of said OR stage is used to determine whether said spare subarray decoding circuitry is activated.

15. The apparatus of claim 10, wherein said delay tracking clock generator further comprises:

an input corresponding to an inverted value of said clock signal;

an output precharged to a logic low level;

a plurality of NFET devices configured to provide a capacitive load on an internal node precharged to a logic high level, wherein a discharge of said internal node following an active low input to said delay tracking clock generator causes said precharged low output to be pulled up to logic high so as to generate said delay tracking clock signal.

16. The apparatus of claim 15, wherein said capacitive load of said delay tracking clock generator is configured so as to enable the generation of said delay tracking clock signal to correspond to a discharge of said precharged output of said dynamic stage following a one-bit mismatch condition.

17. A method for implementing memory redundancy control, the method comprising:

configuring a plurality of compare stages to compare bits of a requested memory address to fuse information bits corresponding to one of a plurality of defective memory address;

each compare stage further comprising a static exclusive OR (XOR) block for each bit in said memory address, said static XOR blocks configured to compare an individual bit of said requested memory address with an individual fuse information bit, with outputs of said static XOR blocks inputted to a dynamic NOR stage for each of said defective memory addresses;

each dynamic NOR stage having a precharged output so as to initially deactivate primary subarray decoding circuitry, said dynamic NOR stages further triggered by a clock signal thereto;

upon activation of said clock signal, the output of a given dynamic NOR stage remains precharged whenever a match exists between said requested memory address and the defective memory address corresponding to the given dynamic NOR stage, and the output of the given dynamic NOR stage is discharged whenever a mismatch exists between said requested memory address and said defective memory address; and configuring a delay tracking clock generator to generate a delay tracking clock signal with respect to said dynamic NOR stages, said delay tracking clock signal configured to gate the outputs of said dynamic NOR stages to spare subarray decoding circuitry, wherein said spare subarray decoding circuitry is activated whenever any of the outputs of said dynamic stages remains precharged following activation of said clock signal.

* * * * *